United States Patent
Åström et al.

(10) Patent No.: US 6,205,039 B1
(45) Date of Patent: *Mar. 20, 2001

(54) DEVICE FOR SUPERVISING A HIGH VOLTAGE CONVERTER STATION

(75) Inventors: Urban Åström, Saxdalen; Hans Björklund, Ludvika; Krister Nyberg, Smedjebacken; Roland Siljeström, Grängesberg; Gunnar Asplund, Ludvika, all of (SE)

(73) Assignee: ABB AB (SE)

( * ) Notice: Subject to any disclaimer, the term of this patent is extended or adjusted under 35 U.S.C. 154(b) by 0 days.

This patent is subject to a terminal disclaimer.

(21) Appl. No.: 09/445,550
(22) PCT Filed: May 20, 1998
(86) PCT No.: PCT/SE98/00944
§ 371 Date: Dec. 9, 1999
§ 102(e) Date: Dec. 9, 1999
(87) PCT Pub. No.: WO98/57415
PCT Pub. Date: Dec. 17, 1998

(30) Foreign Application Priority Data

Jun. 11, 1997 (SE) .................................................. 9702221

(51) Int. Cl.[7] .................................................. H02H 7/12
(52) U.S. Cl. .................................................. 363/50; 363/57
(58) Field of Search .................................................. 363/50, 51, 54, 363/57

(56) References Cited

U.S. PATENT DOCUMENTS

| 4,651,251 | * | 3/1987 | Thiele ..................................... 361/91 |
| 5,155,673 | * | 10/1992 | Takahashi et al. ..................... 363/54 |
| 5,367,197 | * | 11/1994 | Klerfors ................................ 307/105 |
| 5,452,196 |   | 9/1995 | Itoh . |
| 5,521,526 | * | 5/1996 | Nyberg et al. ......................... 324/765 |
| 5,946,178 | * | 8/1999 | Bijlenga ................................ 363/132 |
| 6,084,787 | * | 7/2000 | Nyberg et al. ......................... 363/51 |

FOREIGN PATENT DOCUMENTS

| 0170879 | 2/1986 | (EP) . |
| 9630994 | 10/1996 | (WO) . |

\* cited by examiner

*Primary Examiner*—Adolf Deneke Berhane
(74) *Attorney, Agent, or Firm*—Dykema Gossett, PLLC

(57) ABSTRACT

A device in a valve on high voltage potential level and in a high voltage converter station comprises members arranged on high voltage level and adapted to detect parameters of a voltage divider circuit consisting of resistances (24, 25) and capacitors (27, 28) connected in series and across each thyristor of said valve. The capacitors are of self-healing type, in which from the point of time for occurring of a possible fault thereof the capacitance is gradually reduced, and said members are adapted to carry out measurements so as to determine whether the capacitance of the capacitors is changed over the time.

7 Claims, 1 Drawing Sheet

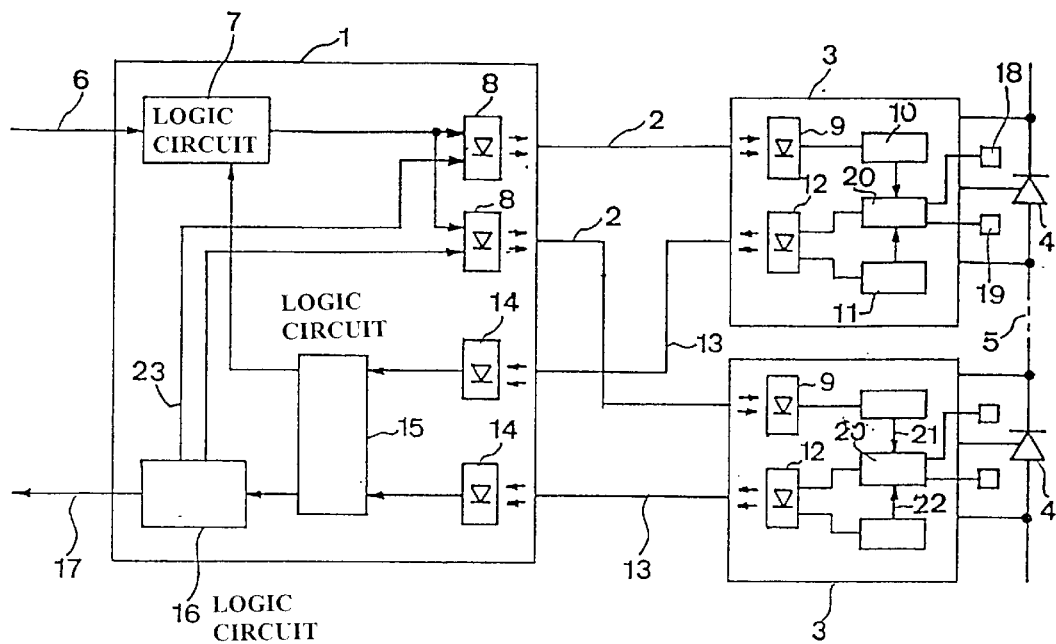
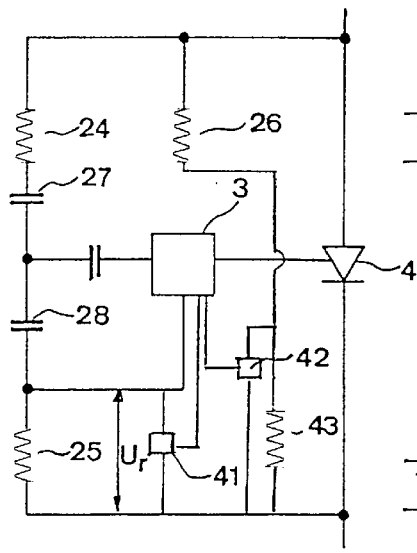
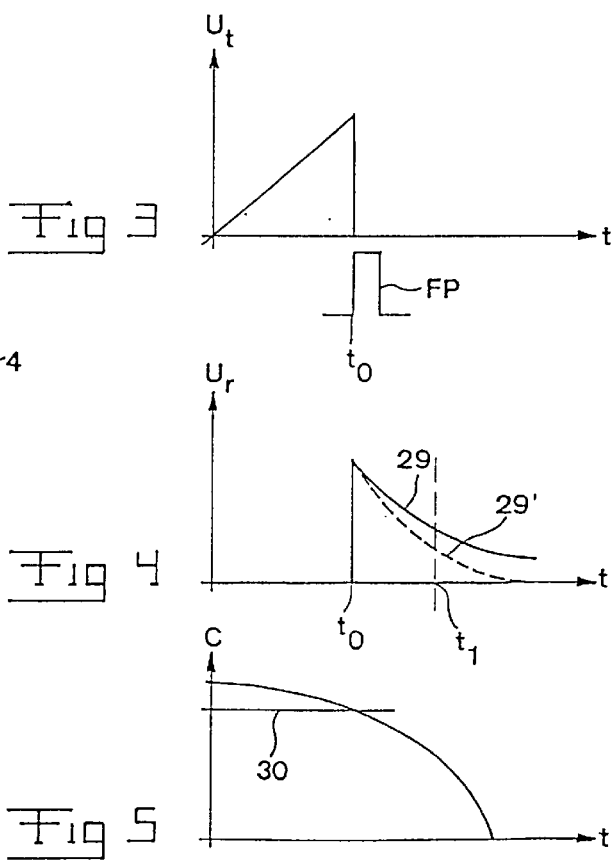

DEVICE FOR SUPERVISING A HIGH VOLTAGE CONVERTER STATION

FIELD OF THE INVENTION AND PRIOR ART

The present invention relates to a device in a line commutated valve of a high voltage converter station located at a high voltage potential level and having a plurality of valve units each having at least one semiconductor component of turn-on-type in the form of a thyristor and for each thyristor first control unit located on high voltage potential level and controlling the thyristor, said first control units being connected to a valve control unit located at a low potential level for communication between the valve control unit and the first control units, and said device being designed to supervise a voltage divider circuit connected across each thyristor and consisting of resistances and capacitors connected in series.

Such high voltage converter stations may for example be stations in plants for transmitting electric power through High Voltage Direct Current (HVDC) for converting direct voltage into alternating voltage and conversely, but the invention is not restricted thereto, but is directed to supervising of all types of high voltage converter stations, in which high voltage here typically may be voltages within the range 10–500 kV. Each valve unit has usually a plurality of semiconductor components in the form of thyristors connected in series, which are controlled simultaneously, so that they act as one single switch, and among which the voltage to be held by the valve unit in a turned-off state of said semiconductor components is distributed, since they normally only can hold 1–10 kV each.

Since high powers are handled by such a high voltage converter station and by that a drop out of parts thereof or the entire station during a certain period of time generates high costs, it is an important desire to be able to supervise different positions of said valve so as to be able to take necessary measures upon deviations from the normal state thereof for avoiding operation interruptions not planned as far as possible and minimise the closing times for maintenance by receiving information about exactly which components have a defect. Information about components starting to get deviating properties without being defect for that sake is also of interest, since correcting measures may be planned timely.

However, the different said positions are located at a high voltage potential level, which makes the supervision thereof difficult, so that the way of proceeding has until now with respect to most of the positions been restricted to carrying out a measurement of a parameter associated with the position in question at a ground potential level so as to then calculate a probable value of the parameter on high voltage potential level. It was therefore until now not possible to supervise a voltage divider circuit mentioned in the introduction, which could have led to unplanned operation interruptions.

SUMMARY OF THE INVENTION

The object of the present invention is to provide a device of the type defined in the introduction, which improves the possibilities to check the state of said voltage divider circuit and by that of such a valve considerably and by that avoid unnecessary breakdowns of components and unplanned operation interruptions.

This object is according to the invention obtained by providing a device of the type defined in the introduction, in which the capacitors of the voltage divider circuit are of a so called self-healing type, in which the capacitance decreases gradually as of the point of time for occurring of a possible defect thereof, that the first control unit associated with the respective thyristor is arranged to register the voltage across the thyristor through said member through a first resistance of the voltage divider at an instant immediately before the turning-on of the thyristor and by that short-circuiting of the capacitor of the voltage divider and through said member register the voltage across a second resistance in the voltage divider circuit at given point of time after said instant, that said means is arranged to calculate a value of the capacitance of the capacitor of the voltage divider on the basis of said values of these two voltages and send information depending thereupon to an arrangement for supervising the valve arranged at a low potential level, and that members are adapted to compare said capacitance value with a rated value of said capacitance and the supervising arrangement is arranged to determine whether a fault has occurred in the voltage divider on the basis of this comparison. By utilising said information about the voltage across said resistances available on high voltage potential level in this way a possible fault of the voltage divider circuit in question may be reliably detected in the supervising arrangement at a "ground level". Thus, this may take place by combining said voltage measurement with the use of so called self-healing capacitors having defined properties.

According to a preferred embodiment of the invention the supervising arrangement is adapted to determine that a capacitor fault has occurred when a capacitance value calculated falls below said rated value by a given proportion. Thus, a capacitor fault of the voltage divider circuit may in this way be detected through this comparison.

According to another preferred embodiment of the invention a supervising arrangement is adapted to determine that a resistance fault has occurred when a capacitance value calculated exceeds said rated value by a given proportion. Thus, should the capacitance value calculated suddenly exceed said rated value by a given proportion it may not be a question of any capacitor fault any longer, but the resistance has instead become to high. The probability of an occurrence of a resistance fault at the same time as a capacitor fault and that these two faults would balance each other is very low.

According to another preferred embodiment of the invention, which is directed to a device in which the first control units are connected to a valve control unit arranged on low potential level through light conductors for communication between the valve control units and the first control units while separating them galvanically, the first control units have means for treating said values detected and the first control units are adapted to utilise light conductors led back therefrom to the valve control unit to send information resulting from said treatment to the supervising arrangement.

By arranging an increased intelligence on high voltage potential level in this way, i.e. in said first control units for controlling the semiconductor components, and utilising the light conductors already there for sending information resulting from said treatment by said means to the supervising arrangement located on low potential level, it is possible to ensure a reliable supervising of the different positions of such a valve and by that receive a good picture of the state of the valve by simple means and by that at a low cost. By carrying out said measurements on high voltage potential level the parameters in question are measured exactly where the value thereof is of interest, wherethrough sources of fault are reduced to a minimum. Furthermore, no additional arrangements for bringing the values in question to the "ground" is required, since the light conductors already there are used for this purpose while obtaining the galvanic separation required between the high voltage potential level and the low potential level. The only thing required is that said first control units are supplemented by said means and the different measuring members are applied on suitable places and connected to the first control unit, which may take place through conductors of electricity.

Further advantages as well as advantageous features of the invention appear from the following description and the other dependent claims.

BRIEF DESCRIPTION OF THE DRAWING

With reference to the appended drawing, below follows a description of a preferred embodiment of the invention cited as an example.

In the drawing:

FIG. 1 is a simplified diagram illustrating the principle of the function of a device according to a preferred embodiment of the invention, FIG. 2 is a voltage divider circuit of a part of a device according to a preferred embodiment of the invention, FIG. 3 is a graph illustrating the development of the voltage across the thyristor, with which the voltage divider circuit in FIG. 2 is associated, before and after turning the thyristor on, FIG. 4 is a graph illustrating the development of the voltage across a resistance of the voltage divider circuit according to FIG. 2 over the the time after turning said thyristor on, and FIG. 5 is a graph illustrating the development of the capacitance of a self-healing capacitor over the time from the point of time for the occurrence of a fault of the capacitor.

DETAILED DESCRIPTION OF A PREFERRED EMBODIMENT OF THE INVENTION

The general construction of a valve of a high voltage converter station, for example for converting High Voltage Direct Current (HVDC) into alternating current and conversely and a valve control unit associated therewith, are schematically illustrated in FIG. 1, as well as schematically how the invention may be realised. A valve control unit 1 is in the converter station adapted to communicate through light conductors 2, i.e. opto-cables, with control units 3 for controlling semiconductor components 4 of turn-on type belonging to the valve units, in the form of thyristors, in which the control only relates to turn-on. A greater number of such semiconductor components are usually connected in series within one single valve unit and intended to be controlled simultaneously through a control unit 3 each, which is indicated through the dashed line at 5. A valve consists in its turn of a plurality of such valve units. We will for the sake of simplicity in the description now following assume that the semiconductor components consist of thyristors which may not be turned off, although the invention is not in any way restricted thereto.

The valve control unit 1 is located on low voltage potential level, i.e. on earth, and it receives in a conventional way a control pulse through an input 6 to a logic circuit 7 for normal turning-on or firing, which sends a turn-on or firing signal further to different light emitting diodes 8 so as to make the light conductors to send firing signals to all the thyristor control units 3 belonging to the valve unit. The thyristor control units have light emitting diodes 9 adapted to receive the firing signals and through a firing circuit 10 act upon the gate of the thyristor 4 for taking care of a turning-on of the thyristor. The thyristor control unit has in a conventional way also a circuit 11 for sending an indication pulse to light emitting diodes 12 and further through light conductors 13 to photo diodes 14 of the valve control unit so as to indicate that the voltage across the thyristor in question in the forward biased direction thereof is sufficient for making a turn-on possible to take place rapidly and efficiently with low power losses during the firing step.

The indication pulses go further through a logic circuit 15, the function of which will be explained further below, to the circuit 7 so as to control the sending of a firing pulse thereby. The valve control unit 1 has also a logic circuit 16 for supervising the different positions of the valve for sending them from the valve control unit through a supervising bus 17.

Except from the particular arrangement of the circuits 15 and 16 the features described above are part of the prior art. The characterising features of the invention will now be described.

The supervising device comprises members 18, 19 schematically indicated adapted to detect function parameters of the valve on high voltage potential level and send values detected thereby to the thyristor control units 3. Such members are here arranged in the vicinity of each of the thyristors. Furthermore, the device has means 20 belonging to the thyristor control unit adapted to process the values detected by the members 18 and 19. Said means 20 are connected to the light emitting diodes so as to send information resulting from said processing through the light conductors 13. This means 20 is constituted by a micro computer with a low consumption of power, which receives measurement values from the members 18 and 19 and after processing thereof sends codes out on the light conductors 13. The sending of this information is then preferably synchronised with the sending of firing and/or indication pulses, which is indicated by the arrows 21, 22. The signals coming from the light conductors 13 to the valve control unit are filtrated in the logic circuit 15 for indication pulses, so that the indication pulses are sent on to the circuit 7 while the data emanating from the means 20 are sent further to the supervising arrangement 16 for a suitable treatment therein.

The supervising arrangement has also an output 23 connected to the light conductors 2 through the light emitting diodes 8 for sending messages to the thyristor control units 3, such as for example additional firing pulses so as to check the function of the different thyristors.

The voltage divider circuit arranged across the thyristor 4 of the valve unit is illustrated in FIG. 2, said circuit consisting of resistances 24, 25 and capacitors 27, 28 connected in series for obtaining a dynamic voltage division. The capacitors 27, 28 have together a capacitance C and the resistors 24, 25 have together a resistance R, so that the circuit in question gives a well-defined time constant RC. Furthermore, resistors 26 and 43 are arranged for static voltage division. Faults in the voltage divider circuit may lead to thyristor breakdown would they not be discovered early. The present invention intends to do this and is based on the fact that the capacitors 27, 28 are capacitors of so called self-healing type, which means that they will not be destroyed instantaneously upon an occurrence of a fault, but the capacitance thereof is gradually reduced from the point of time of the occurrence of the fault, so that the time constant of the circuit is reduced thereby. This fact is utilised according to the invention by measuring the current through the voltage divider at two different points of time $t_0$ and $t_1$. More exactly, this is made at a first point of time corresponding to the point of time for the firing of the thyristor and at a second point of time $t_1$, located later in the time, for example about 100 micro seconds after the first point of time. Members for measuring voltage are illustrated by the blocks 41 and 42, but there are in practice no separate members therefore, but the thyristor control unit has all the time knowledge about the magnitude of $U_r$ and $U_t$. It is illustrated in FIG. 3 how the voltage $U_7$ across the thyristor 4 increases in the forward biasing direction thereof to the point of time $t_0$ for receiving a firing signal FP, in which it falls to approximately zero. The RC-circuit is short-circuited at the firing and the capacitors 27 and 28 are discharged through the resistors 24 and 25, so that the current I through the circuit will sink according to the formula:

$$I(t) = I(t_0)e^{-\frac{(t-t_0)}{RC}} \quad (1)$$

where R is constituted by the resistances 24 and 25 and C is the total capacitance for the capacitors 27 and 28.

$I(t_0)$ results from $$\frac{U_{t_0}}{R},$$

since the voltage across the capacitors is at the time $t_0$ very close to the voltage across the thyristor, i.e. $U_{t_0}$, so that the value for $U_t(t_0)$ is obtained by the measuring member 42 as the thyristor voltage exactly before the instant of firing.

A value of I(t) is obtained through the voltage $U_r$ through the relation $$I(t) = \frac{Ur(t)}{R}$$

Introducing the voltage at the point of time $t_1$ results in the following expression for the total capacitance of the capacitors 27 and 28:

$$C = \frac{t_1 - t_0}{\left[\ln\left(\frac{Ut(t_0)}{U_r(t_1)}\right)\right]R} \quad (2)$$

It is illustrated in FIG. 4 by the line 27 how the voltage $U_r$ develops for the perfect voltage divider circuit. However, should a fault occur in any of the capacitors the overall capacitance will sink from the moment of occurrence of the fault at the point of time zero according to the curve shown in FIG. 5. This means that the voltage $U_r$ will sink more rapid than for a voltage divider circuit, as indicated by the dashed curve 29' in FIG. 4. A lower value of the capacitance will by this be determined through the formula (2). Members are arranged in the thyristor control unit 3 for comparing the capacitance value calculated in this way with a rated value of the capacitance and register a capacitor fault when falling below said rated value by a given proportion, which is indicated by the line 30 in FIG. 5, and send such information through the light conductors 13 (see FIG. 1) to the supervising arrangement of the valve control unit.

However, would a fault occur in any of the resistors 24, 25, 26 or 43, so that the resistances thereof are changed considerably, the capacitance value calculated will then instead deviate from said rated value by a given proportion, in which a resistance fault is determined after the comparison has been carried out and information thereabout is sent to the supervising arrangement. This information to the supervising arrangement makes it possible to take decisions to exchange the capacitor or the resistor timely before the thyristor will be destroyed.

Another possible way to determine the RC-time is to measure the time between two voltage levels. The voltage across R gives a measuring value of $I_r$. When the voltage $U_r$ across the resistor at any time after the time $t_0$ sinks below a first voltage $U_1$ the comparator starts a clock, which stops when a lower level $U_2$ is passed at the time $t_1$. The time $t=t_1-t_0$ gives a value of the time constant, which is compared to a reference value. A too small At indicates that the capacitor is broken.

However, the measurement has to be synchronised with the firing pulse, so that the measurement is carried out only about 100–200 $\mu$s after firing. This is important because there will be pulses and transients across the resistance during the interval when the thyristor is not conducting, and this pulses result in erroneous curve shapes, since they are not capacitor dischargings but transients produced when other valves in the bridge commutate.

The invention is of course not in any way restricted to the preferred embodiment described above, but many possibilities and modifications thereof would be apparent to a man skilled in the art without departing from the basic idea of the invention as defined in the claims.

With respect to the comparing members of the embodiment for checking the voltage divider circuit, it is pointed out that the claims are intended to comprise both an arrangement thereof in said first control unit and on low voltage potential level, for example in the valve control unit.

Although it is advantageous to utilise light conductors present for the firing function for transmitting information from high potential level to low potential level this may also take place through separate conductors.

What is claimed is:

1. A device in a line commutated valve of a high voltage converter station located on high voltage potential level and having a plurality of valve units each having at least one semiconductor component of turn-on-type in the form of a thyristor and for each thyristor a first control unit located on high voltage potential level and controlling the thyristor, each of said first control units being connected to a valve control unit located on low potential level for communication between the valve control unit and the first control units, and said device for supervising a voltage divider circuit connected across each thyristor including resistances and capacitors connected in series, wherein the capacitors of the voltage divider circuit comprises a self-healing type, in which the capacitance decreases gradually as of the point of time for occurring of a possible defect thereof, the first control unit associated with the respective thyristor is arranged to register the voltage across the thyristor through a member arranged on high potential level through a first resistance of the voltage divider at an instant immediately before the turning-on of the thyristor and by that short-circuiting of the capacitor of the voltage divider and through a member register the voltage across a second resistance in the voltage divider circuit at given point of time after said instant, said means is arranged to calculate a value of the capacitance of the capacitor of the voltage divider on the basis of said values of two voltages and send information depending thereupon to an arrangement for supervising the valve arranged on low potential level, and members adapted to compare said capacitance value with a rated value of said capacitance and the supervising arrangement being arranged to determine whether a fault has occurred in the voltage divider on the basis of the comparison.

2. A device according to claim 1, wherein said member is adapted to register said voltage at a given instant corresponding to the point of time for the turning-on of the thyristor in question through the first control unit associated therewith.

3. A device according to claim 2, wherein the measuring member is adapted to carry out said two voltage registrations with a time interval of in a range of about 50 and about 22 $\mu$s.

4. A device according to claim 1, wherein the supervising arrangement is arranged to determine that a capacitor fault has occurred when a capacitance value calculated falls below said rated value by a given proportion.

5. A device according to claim 1, wherein the supervising arrangement is adapted to determine that a resistance fault has occurred when a capacitance value calculated exceeds said rated value by a given proportion.

6. A device according to claim 1, in which the first control units are connected through light conductors with a valve control unit arranged on low potential level for communication between the valve control unit and the first control units while separating them galvanically, wherein the first control unit has means for treating said values detected, and that the first control units are adapted to utilise light conductors running back therefrom to the valve control unit for sending information resulting from said treatment to an arrangement for supervising said valve arranged on low potential level.

7. A device according to claim 1 adapted to supervise valves included in converters in a station for converting high voltage direct current (HVDC) into alternating current and conversely.

* * * * *